United States Patent
Chou et al.

(10) Patent No.: US 8,501,566 B1
(45) Date of Patent: Aug. 6, 2013

(54) METHOD FOR FABRICATING A RECESSED CHANNEL ACCESS TRANSISTOR DEVICE

(75) Inventors: Chung-Yen Chou, New Taipei (TW); Tieh-Chiang Wu, Taoyuan County (TW); Hsin-Jung Ho, New Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/609,289

(22) Filed: Sep. 11, 2012

(51) Int. Cl.
*H01L 21/336* (2006.01)

(52) U.S. Cl.
USPC ........... 438/270; 438/268; 438/269; 438/172; 438/294; 438/295; 257/77; 257/192; 257/194; 257/329

(58) Field of Classification Search
USPC .................... 257/77, 329, 192, E29.255, 194, 257/E29.246, E21.403; 438/268–270, 172, 438/294–296
See application file for complete search history.

(56) References Cited

U.S. PATENT DOCUMENTS

| | | | | |
|---|---|---|---|---|
| 4,631,568 A | * | 12/1986 | Gardner | 257/578 |
| 4,696,095 A | * | 9/1987 | Thomas | 438/294 |
| 5,880,035 A | * | 3/1999 | Fukuda | 438/734 |
| 6,352,908 B1 | * | 3/2002 | King et al. | 438/439 |
| 6,451,639 B1 | * | 9/2002 | Jang et al. | 438/183 |
| 6,544,848 B1 | * | 4/2003 | Ang et al. | 438/260 |
| 6,773,985 B2 | * | 8/2004 | Suh | 438/243 |
| 7,253,470 B1 | * | 8/2007 | Liu et al. | 257/316 |
| 7,635,633 B2 | * | 12/2009 | Oh et al. | 438/288 |
| 7,772,637 B2 | * | 8/2010 | Sohn et al. | 257/316 |
| 7,790,559 B2 | * | 9/2010 | Adkisson et al. | 438/287 |
| 8,012,828 B2 | * | 9/2011 | Min et al. | 438/259 |
| 8,187,940 B2 | * | 5/2012 | Lee et al. | 438/270 |
| 2002/0072197 A1 | * | 6/2002 | Kang et al. | 438/424 |
| 2002/0163039 A1 | * | 11/2002 | Clevenger et al. | 257/340 |
| 2004/0137689 A1 | * | 7/2004 | Dokumaci et al. | 438/305 |
| 2005/0282338 A1 | * | 12/2005 | Yoo et al. | 438/257 |
| 2006/0017099 A1 | * | 1/2006 | Paik | 257/330 |
| 2006/0205148 A1 | * | 9/2006 | Deppe et al. | 438/257 |
| 2006/0237817 A1 | * | 10/2006 | Park | 257/500 |
| 2007/0296031 A1 | * | 12/2007 | Tanaka | 257/330 |
| 2008/0012067 A1 | * | 1/2008 | Wu | 257/330 |
| 2010/0013004 A1 | * | 1/2010 | Wu et al. | 257/327 |
| 2010/0055871 A1 | * | 3/2010 | Hanafi et al. | 438/455 |
| 2010/0237397 A1 | * | 9/2010 | Uchiyama | 257/306 |
| 2011/0156123 A1 | * | 6/2011 | Fumitake | 257/315 |
| 2011/0210376 A1 | * | 9/2011 | Grupp et al. | 257/192 |
| 2012/0146097 A1 | * | 6/2012 | Endo et al. | 257/194 |
| 2012/0326168 A1 | * | 12/2012 | Adam et al. | 257/77 |
| 2013/0140629 A1 | * | 6/2013 | Grupp et al. | 257/329 |

* cited by examiner

*Primary Examiner* — N Drew Richards
*Assistant Examiner* — Ankush Singal
(74) *Attorney, Agent, or Firm* — Winston Hsu; Scott Margo

(57) ABSTRACT

A method for fabricating a recessed channel access transistor device is provided. A semiconductor substrate having thereon a recess is provided. A gate dielectric layer is formed in the recess. A gate material layer is then deposited into the recess. A dielectric cap layer is formed on the gate material layer. The dielectric cap layer and the gate material layer are etched to form a gate pattern. A liner layer is then formed on the gate pattern. A spacer is formed on the liner layer on each sidewall of the gate pattern. The liner layer not masked by the spacer is etched to form an undercut recess that exposes a portion of the gate material layer. The spacer is then removed. The exposed portion of the gate material layer in the undercut recess is oxidized to form an insulation block therein.

9 Claims, 3 Drawing Sheets

METHOD FOR FABRICATING A RECESSED
CHANNEL ACCESS TRANSISTOR DEVICE

BACKGROUND OF THE INVENTION

1. Field of the Invention

The present invention relates generally to a method of fabricating a semiconductor device. More particularly, the present invention relates to a method of fabricating a recessed channel access transistor (RCAT) device for high-density dynamic random access memory (DRAM) applications.

2. Description of the Prior Art

As the size of semiconductor devices shrinks, the gate channel length decreases correspondingly. Consequently, a short channel effect may occur. To cope with such problem, recessed channel access transistor devices (or RCAT devices in short) have been developed to suppressing the short channel effect by physically increasing the gate channel length without an increase in a lateral area of a gate electrode.

Typically, an RCAT transistor has a gate oxide layer formed on sidewalls and the bottom surface of a recess etched into a substrate, where a conductive substance fills the recess, contrary to a planar gate type transistor having a gate electrode formed on a planar surface of a substrate. Therefore, the integration of the recessed-gate transistor can be increased.

However, in a conventional RCAT device, when a drain voltage (Vd) is applied to a capacitor that is electrically connected to an NMOS transistor, a gate induced drain leakage (GIDL) problem may occur. A sharp upper corner of the poly gate and the relative thinner gate oxide layer near the sharp corner of the poly gate result in a concentrated electric field at the cell side of a DRAM cell. The concentrated electric field leads to the leakage. The GIDL adversely affects the refresh or data retention characteristic of the DRAM device.

SUMMARY OF THE INVENTION

It is therefore one objective of the present invention to provide an improved method of fabricating a recessed channel access transistor device to solve the above-mentioned prior art problems or shortcomings.

According to one embodiment of the invention, a method for fabricating a recessed channel access transistor device is provided. A semiconductor substrate having thereon a recess is provided. A gate dielectric layer is formed in the recess. A gate material layer is then deposited into the recess. A dielectric cap layer is formed on the gate material layer. The dielectric cap layer and the gate material layer are etched to form a gate pattern. A liner layer is then formed on the gate pattern. A spacer is formed on the liner layer on each sidewall of the gate pattern. The liner layer not masked by the spacer is etched to form an undercut recess that exposes a portion of the gate material layer. The spacer is then removed. The exposed portion of the gate material layer in the undercut recess is oxidized to form an insulation block therein.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
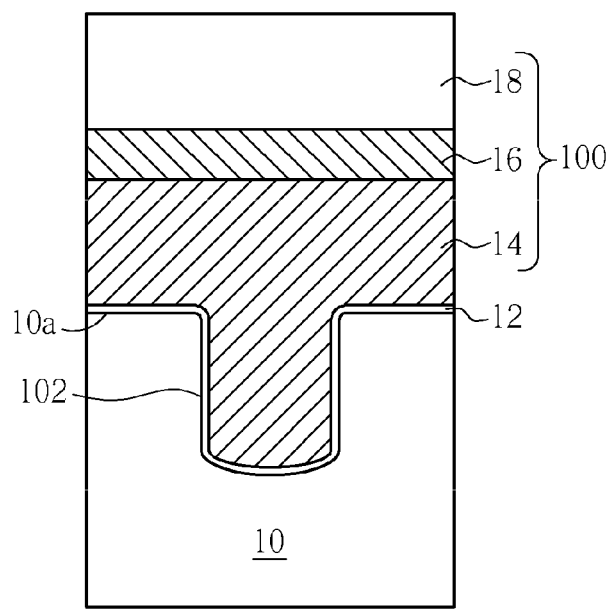
FIGS. 1-6 are schematic, cross-sectional diagrams showing an exemplary method for fabricating a recessed channel access transistor (RCAT) device in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description, reference is made to the accompanying drawings, which form a part hereof, and in which is shown by way of illustration specific examples in which the embodiments may be practiced. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated.

FIGS. 1-6 are schematic, cross-sectional diagrams showing an exemplary method for fabricating a recessed channel access transistor (RCAT) device in accordance with one embodiment of the present invention. As shown in FIG. 1, a semiconductor substrate 10 such as a silicon substrate or a substrate containing a silicon layer is provided. The semiconductor substrate 10 has a major surface 10a and has at least one recess 102 etched into the major surface 10a of the semiconductor substrate 10. After the formation of the recess 102, a gate dielectric layer 12 such as silicon oxide or high-k oxide is formed on the interior surface of the recess 102. The gate dielectric layer 12 also overlies the major surface 10a.

Subsequently, a film stack 100 is formed on the substrate 10. For example, a gate material layer 14 is first deposited into the recess 102 and completely fills the recess 102. According to this embodiment, the gate material layer 14 comprises, for example, polysilicon or doped polysilicon. Subsequently, a conductive layer 16 such as a metal layer, including but not limited to tungsten, titanium, titanium nitride or any combination thereof, is deposited onto the gate material layer 14. A dielectric cap layer 18 is then deposited onto the conductive layer 16. The dielectric cap layer 18 may include but not limited to silicon nitride according to this embodiment.

Figure 2:
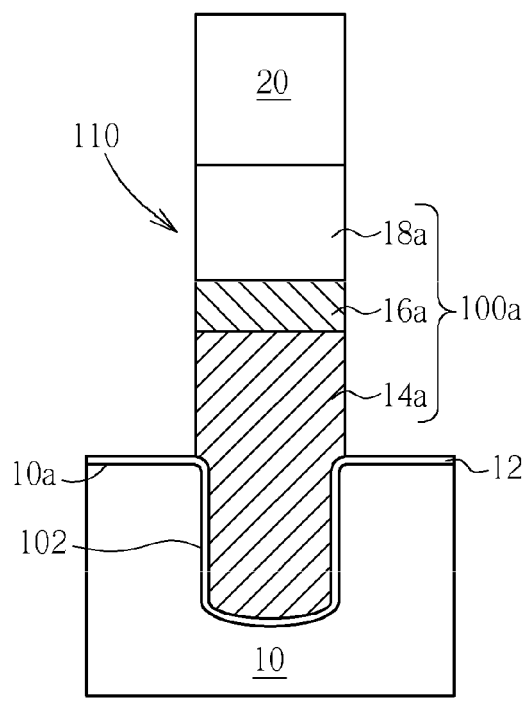

As shown in FIG. 2, thereafter, a patterned photoresist mask 20 is formed on the dielectric cap layer 18. The patterned photoresist mask 20 can be formed by using conventional lithographic processes. After the formation of the patterned photoresist mask 20, an anisotropic dry etching process is performed to etch the dielectric cap layer 18, the conductive layer 16, and the gate material layer 14 that is not covered by the patterned photoresist mask 20. More specifically, according to this embodiment, the portion of the film stack 100 that is not covered by the patterned photoresist mask 20 is completely etched away in one single etching step (one-step etching process), to thereby define a gate pattern 100a having a vertically straight and smooth sidewall 110. The gate pattern 100a includes a patterned gate material layer 14a, a patterned conductive layer 16a and a patterned dielectric cap layer 18a. According to this embodiment, the anisotropic dry etching process stops upon the exposure of the gate dielectric layer 12. The patterned photoresist mask 20 is then stripped off.

Figure 3:
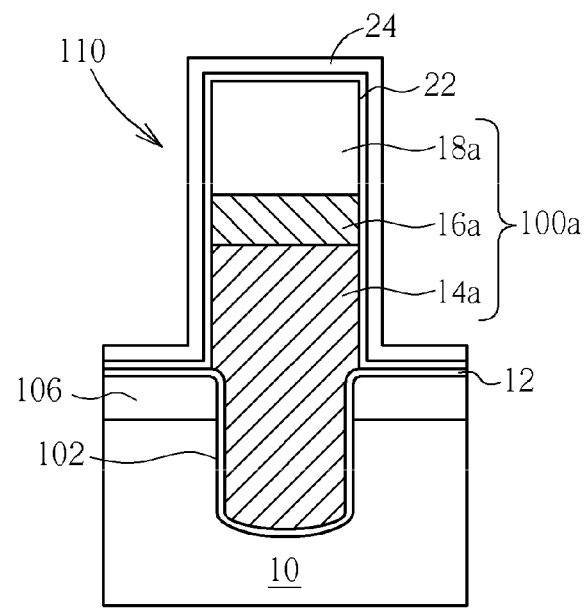

As shown in FIG. 3, after removing the patterned photoresist mask 20 from the gate pattern 100a, a lightly doped drain (LDD) implantation process may be performed to form an LDD region 106 in the semiconductor substrate 10 on either side of the gate pattern 100a. Subsequently, a conformal liner 22 is deposited on the sidewall 110 and the top surface of the gate pattern 100a and on the gate dielectric layer 12. According to this embodiment, the liner 22 may include but not limited to silicon nitride. The deposition of the liner 22 may be conducted by using chemical vapor deposition (CVD) methods or atomic layer deposition (ALD) methods, but not limited thereto. After the deposition of the liner 22, a conformal spacer layer 24 is then deposited onto the silicon nitride liner 22. According to this embodiment, the liner 22 may include but not limited to silicon oxide. It is noteworthy that the liner 22 has high etching selectivity with respect to both the spacer layer 24 and the gate dielectric layer 12.

Figure 4:
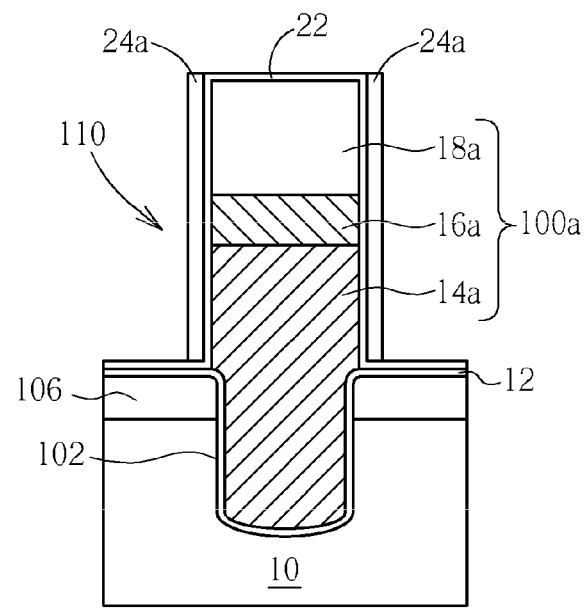

As shown in FIG. 4, after the formation of the liner 22 and the spacer layer 24, an anisotropic dry etching process is carried out to etch the spacer layer 24 selective to the liner 22, thereby forming a spacer 24a on either sidewall 110 of the gate pattern 100a. The spacer 24a masks the liner 22 on either sidewall 110 of the gate pattern 100a.

Figure 5:
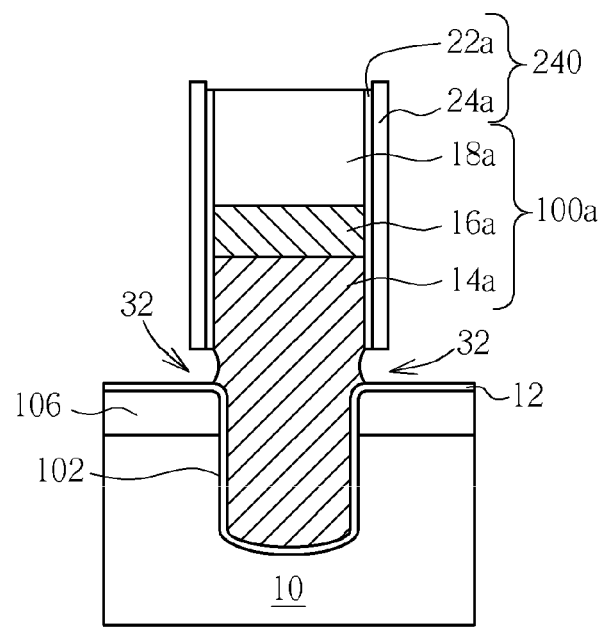

As shown in FIG. 5, after the formation of the spacer 24a, an isotropic etching process such as a wet etching process is performed to etch the exposed liner 22, thereby forming a spacer 22a on either sidewall 110 of the gate pattern 100a. The spacer 22a and the spacer 24a constitute a composite spacer 240. At this point, an undercut recess 32 is formed underneath the composite spacer 240. According to this embodiment, a sidewall of the patterned gate material layer 14a of the gate pattern 100a is exposed in the undercut recess 32.

Figure 6:
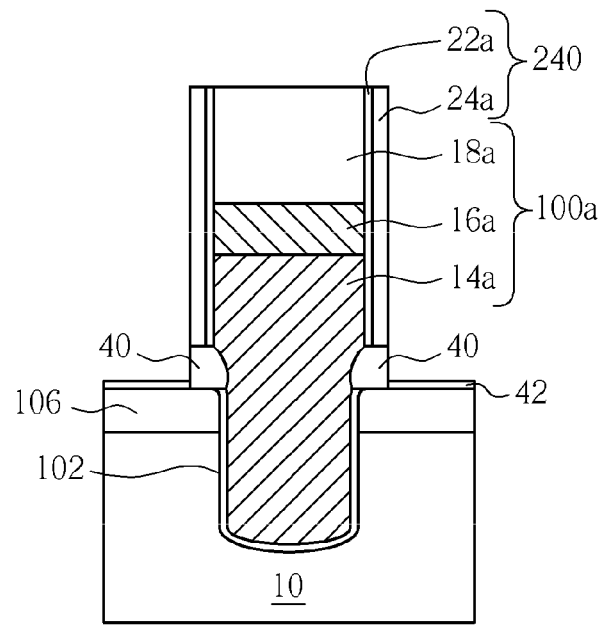

As shown in FIG. 6, after the formation of the undercut recess 32, the spacer 24a is removed. According to this embodiment, the spacer 24a may be removed by using known wet etching methods. The gate dielectric layer 12 may be removed from the major surface 10a to expose a portion of the semiconductor substrate 10. A gate-source/drain oxidation process is then carried out to oxidize the exposed sidewall of the patterned gate material layer 14a and the exposed portion of the semiconductor substrate 10, thereby forming an insulation block 40 in the undercut recess 32 and a silicon oxide layer 42 on the exposed portion of the semiconductor substrate 10. Subsequently, a heavily doped source/drain (S/D) region (not shown) may be formed on either side of the gate pattern 100a to complete the fabrication of the RCAT device.

Those skilled in the art will readily observe that numerous modifications and alterations of the device and method may be made while retaining the teachings of the invention.

What is claimed is:

1. A method for fabricating a recessed channel access transistor device, comprising:
    providing a semiconductor substrate having thereon a recess;
    forming a gate dielectric layer in the recess;
    depositing a gate material layer into the recess;
    forming a dielectric cap layer on the gate material layer;
    patterning the dielectric cap layer and the gate material layer to form a gate pattern;
    forming a liner layer on the gate pattern;
    forming a spacer on the liner layer on each sidewall of the gate pattern;
    etching the liner layer not masked by the spacer to form an undercut recess exposing a portion of the gate material layer;
    removing the spacer; and
    oxidizing the exposed portion of the gate material layer in the undercut recess to form an insulation block therein.

2. The method for fabricating a recessed channel access transistor device according to claim 1, wherein after depositing a gate material layer into the recess, the method further comprises:
    forming a conductive layer on the gate material layer.

3. The method for fabricating a recessed channel access transistor device according to claim 1, wherein the gate material layer comprises polysilicon or doped polysilicon.

4. The method for fabricating a recessed channel access transistor device according to claim 1, wherein the dielectric cap layer comprises silicon nitride.

5. The method for fabricating a recessed channel access transistor device according to claim 1, wherein patterning the dielectric cap layer and the gate material layer to form a gate pattern comprises completely etching away the dielectric cap layer and the gate material layer not covered by a patterned photoresist mask in one single etching step.

6. The method for fabricating a recessed channel access transistor device according to claim 1, wherein the liner layer comprises silicon nitride.

7. The method for fabricating a recessed channel access transistor device according to claim 1, wherein after patterning the dielectric cap layer and the gate material layer to form a gate pattern, the method further comprises:
    performing a lightly doped drain (LDD) implantation process to form an LDD region in the semiconductor substrate on either side of the gate pattern.

8. The method for fabricating a recessed channel access transistor device according to claim 2, wherein the conductive layer comprises tungsten, titanium, titanium nitride or a combination thereof.

9. The method for fabricating a recessed channel access transistor device according to claim 6, wherein the spacer comprises silicon oxide.

* * * * *